United States Patent
Tosaka et al.

(10) Patent No.: US 10,856,423 B2
(45) Date of Patent: Dec. 1, 2020

(54) PREPREG, PRINTED CIRCUIT BOARD, SEMICONDUCTOR PACKAGE, AND METHOD FOR PRODUCING PRINTED CIRCUIT BOARD

(71) Applicant: HITACHI CHEMICAL COMPANY, LTD., Tokyo (JP)

(72) Inventors: Yuji Tosaka, Chikusei (JP); Takeshi Saitoh, Sakuragawa (JP); Yukio Nakamura, Oyama (JP); Ryohta Sasaki, Oyama (JP); Hiroshi Shimizu, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 16/069,916

(22) PCT Filed: Jan. 13, 2017

(86) PCT No.: PCT/JP2017/001133
§ 371 (c)(1),
(2) Date: Jul. 13, 2018

(87) PCT Pub. No.: WO2017/122819
PCT Pub. Date: Jul. 20, 2017

(65) Prior Publication Data
US 2019/0021175 A1  Jan. 17, 2019

(30) Foreign Application Priority Data

Jan. 15, 2016 (JP) ................................ 2016-006478

(51) Int. Cl.
*H05K 3/38* (2006.01)
*H05K 1/03* (2006.01)
(Continued)

(52) U.S. Cl.
CPC ............... *H05K 3/389* (2013.01); *B32B 5/02* (2013.01); *B32B 5/022* (2013.01); *B32B 5/024* (2013.01);
(Continued)

(58) Field of Classification Search
CPC ....... B32B 15/08; B32B 15/09; B32B 15/092; B32B 15/098; B32B 15/14; B32B 15/20;
(Continued)

(56) References Cited

U.S. PATENT DOCUMENTS

| | | | |
|---|---|---|---|
| 2011/0174522 A1* | 7/2011 | Simmons | B32B 5/26 174/122 R |
| 2012/0132462 A1* | 5/2012 | Harazono | H05K 1/0366 174/260 |
| 2016/0039185 A1 | 2/2016 | Kawabe et al. | |

FOREIGN PATENT DOCUMENTS

| | | |
|---|---|---|
| CN | 102725323 A | 10/2012 |
| JP | 2009-212224 A | 9/2009 |

(Continued)

*Primary Examiner* — Camie S Thompson
(74) *Attorney, Agent, or Firm* — Fitch, Even, Tabin & Flannery LLP

(57) ABSTRACT

Provided are a prepreg including two or more fiber substrate layers and one or more resin composition layers, in which at least one of the one or more resin composition layers has a fiber substrate layer on each of both surfaces thereof, a printed circuit board using the prepreg and a method of producing the printed circuit board, and a semiconductor package.

11 Claims, 7 Drawing Sheets

(51) Int. Cl.

| | |
|---|---|
| B32B 15/08 | (2006.01) |
| B32B 27/20 | (2006.01) |
| B32B 27/36 | (2006.01) |
| B32B 15/09 | (2006.01) |
| B32B 27/26 | (2006.01) |
| B32B 27/28 | (2006.01) |
| B32B 5/08 | (2006.01) |
| B32B 27/24 | (2006.01) |
| B32B 5/26 | (2006.01) |
| B32B 7/04 | (2019.01) |
| B32B 27/42 | (2006.01) |
| B32B 27/08 | (2006.01) |
| B32B 27/06 | (2006.01) |
| B32B 5/02 | (2006.01) |
| B32B 27/18 | (2006.01) |
| B32B 15/098 | (2006.01) |
| B32B 15/092 | (2006.01) |
| B32B 15/14 | (2006.01) |
| B32B 15/20 | (2006.01) |
| B32B 27/12 | (2006.01) |
| B32B 27/38 | (2006.01) |
| B32B 37/18 | (2006.01) |
| H01L 21/48 | (2006.01) |
| H01L 23/14 | (2006.01) |
| H01L 23/498 | (2006.01) |
| H05K 3/00 | (2006.01) |
| H05K 3/46 | (2006.01) |

(52) U.S. Cl.
CPC .................. *B32B 5/08* (2013.01); *B32B 5/26* (2013.01); *B32B 7/04* (2013.01); *B32B 15/08* (2013.01); *B32B 15/09* (2013.01); *B32B 15/092* (2013.01); *B32B 15/098* (2013.01); *B32B 15/14* (2013.01); *B32B 15/20* (2013.01); *B32B 27/06* (2013.01); *B32B 27/08* (2013.01); *B32B 27/12* (2013.01); *B32B 27/18* (2013.01); *B32B 27/20* (2013.01); *B32B 27/24* (2013.01); *B32B 27/26* (2013.01); *B32B 27/28* (2013.01); *B32B 27/281* (2013.01); *B32B 27/283* (2013.01); *B32B 27/36* (2013.01); *B32B 27/38* (2013.01); *B32B 27/42* (2013.01); *B32B 37/182* (2013.01); *H01L 21/4857* (2013.01); *H01L 23/145* (2013.01); *H01L 23/49822* (2013.01); *H01L 23/49883* (2013.01); *H05K 1/03* (2013.01); *H05K 1/0366* (2013.01); *H05K 3/0014* (2013.01); *H05K 3/4652* (2013.01); *B32B 2250/05* (2013.01); *B32B 2250/42* (2013.01); *B32B 2255/02* (2013.01); *B32B 2255/26* (2013.01); *B32B 2260/021* (2013.01); *B32B 2260/023* (2013.01); *B32B 2260/046* (2013.01); *B32B 2262/02* (2013.01); *B32B 2262/0223* (2013.01); *B32B 2262/0246* (2013.01); *B32B 2262/0269* (2013.01); *B32B 2262/0276* (2013.01); *B32B 2262/062* (2013.01); *B32B 2262/10* (2013.01); *B32B 2262/101* (2013.01); *B32B 2262/14* (2013.01); *B32B 2264/10* (2013.01); *B32B 2264/101* (2013.01); *B32B 2264/102* (2013.01); *B32B 2264/104* (2013.01); *B32B 2264/107* (2013.01); *B32B 2270/00* (2013.01); *B32B 2305/076* (2013.01); *B32B 2307/206* (2013.01); *B32B 2307/3065* (2013.01); *B32B 2307/718* (2013.01); *B32B 2307/732* (2013.01); *B32B 2311/12* (2013.01); *B32B 2315/085* (2013.01); *B32B 2363/00* (2013.01); *B32B 2457/08* (2013.01); *H05K 2201/0195* (2013.01); *H05K 2203/1305* (2013.01)

(58) Field of Classification Search
CPC ............ B32B 2250/02; B32B 2250/42; B32B 2255/02; B32B 2255/26; B32B 2260/021; B32B 2260/023; B32B 2260/046; B32B 2262/0223; B32B 2262/0246; B32B 2262/0269; B32B 2262/062; B32B 2262/10; B32B 2262/101; B32B 2262/14; B32B 2270/00; B32B 2305/076; B32B 2307/206; B32B 2315/085; B32B 2457/08; B32B 27/06; B32B 27/28; B32B 27/281; B32B 27/283; B32B 27/36; B32B 27/38; B32B 27/42; B32B 5/02; B32B 5/022; B32B 5/024; B32B 5/08; B32B 5/26; B32B 2262/0276; H01L 21/4857; H01L 23/49822; H05K 1/03; H05K 1/0366; H05K 2201/0195; H05K 2201/0191; H05K 3/4652; H05J 2201/0195; Y10T 428/24917; Y10S 428/901

USPC .................... 428/292.1, 901, 332, 415, 209; 174/122 R, 259, 255; 29/846; 156/249

See application file for complete search history.

(56) References Cited

FOREIGN PATENT DOCUMENTS

| | | | |
|---|---|---|---|
| JP | 2011-068138 | A | 4/2011 |
| JP | 2012-231140 | A | 11/2012 |
| JP | 2012-240348 | A | 12/2012 |
| JP | 2014-208457 | A | 11/2014 |
| TW | 201223352 | A | 6/2012 |
| WO | 2012/140907 | A1 | 10/2012 |
| WO | 2015/079820 | A1 | 6/2015 |

\* cited by examiner

[Fig. 1]
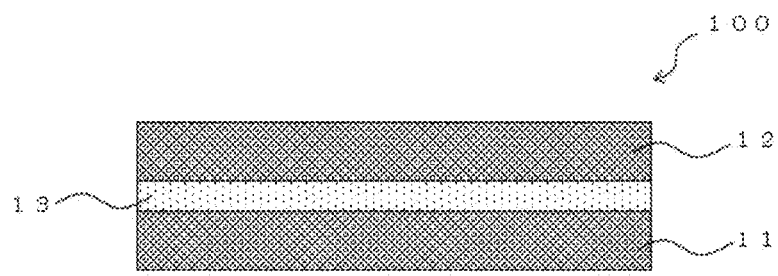
[Fig. 2]
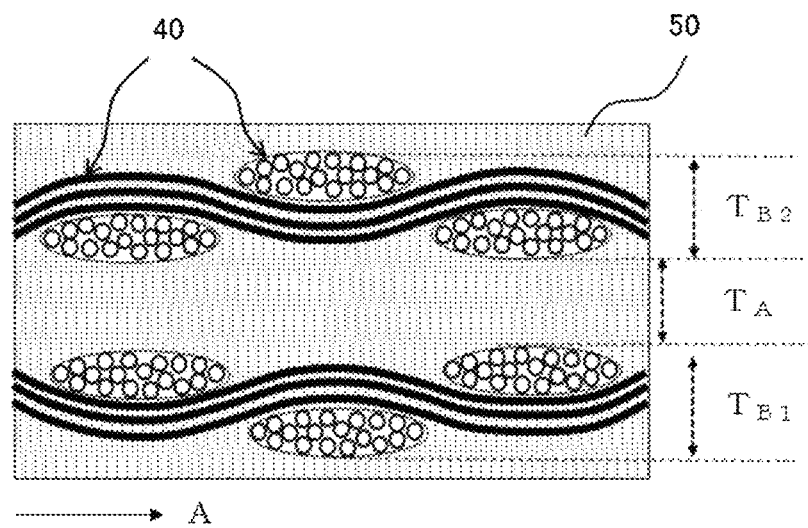

[Fig. 3]
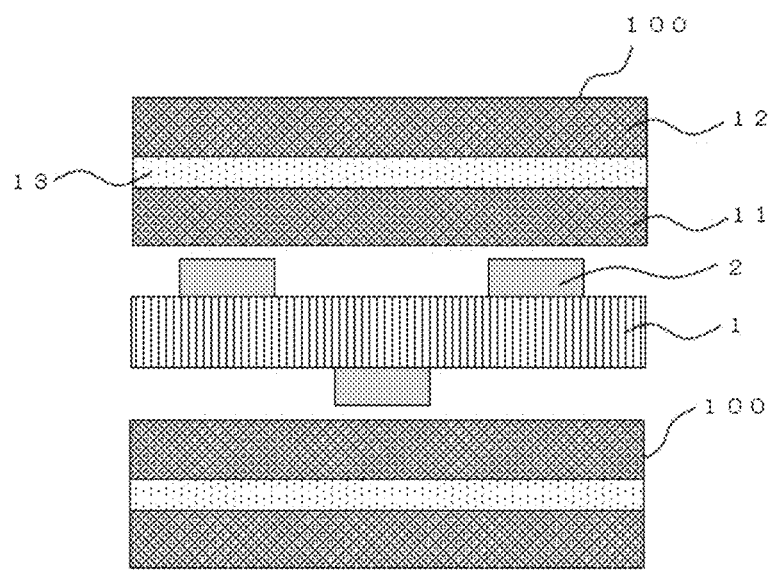
[Fig. 4]
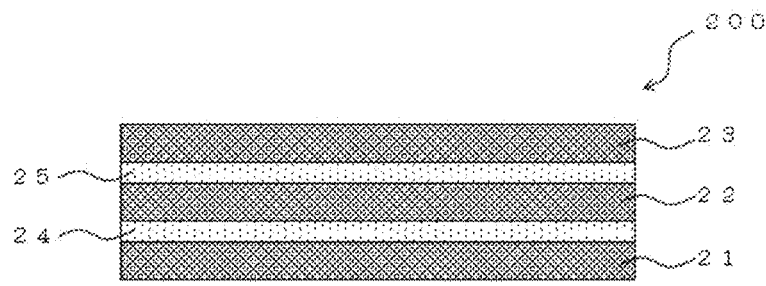

[Fig. 5]
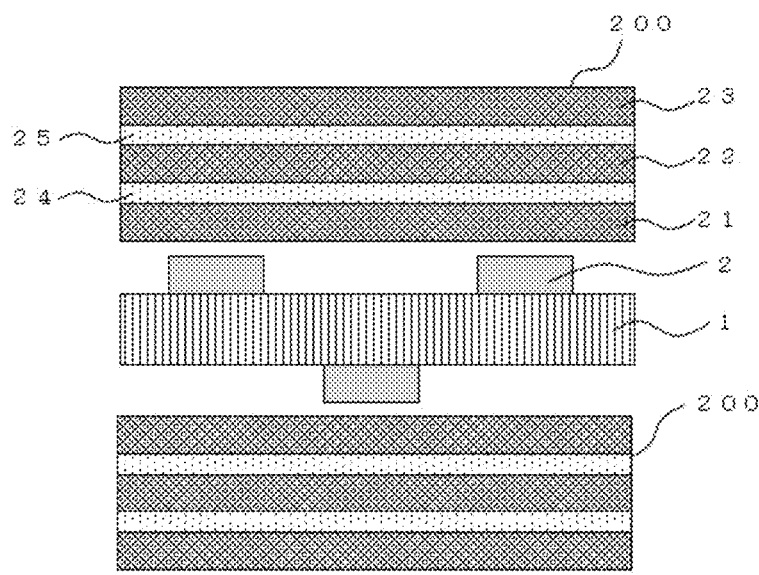
[Fig. 6]
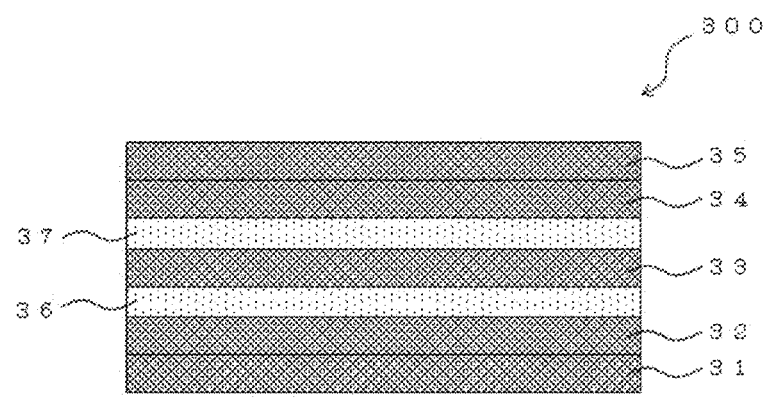

[Fig. 7]
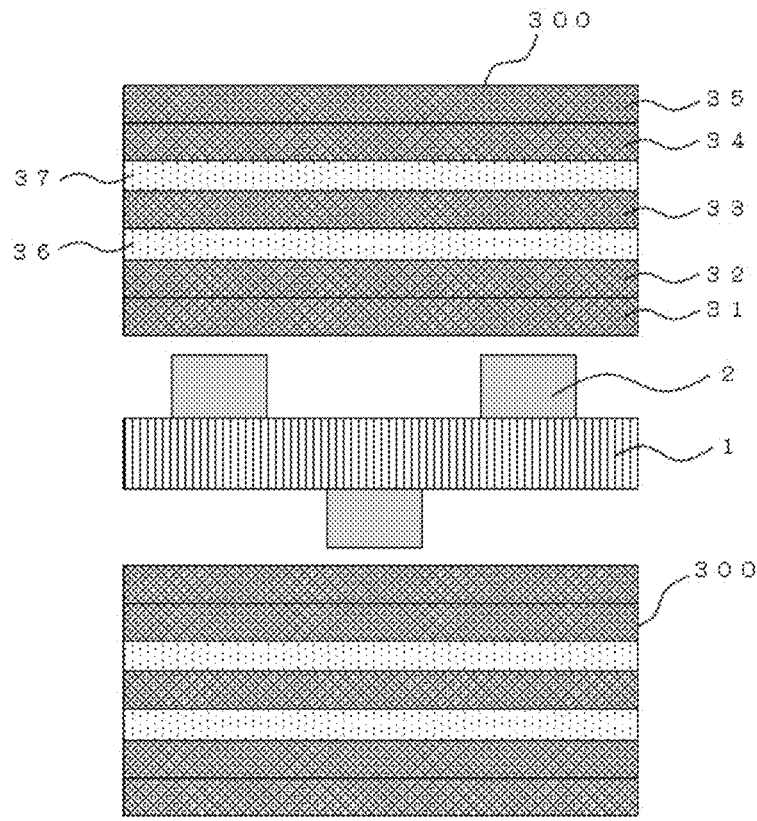
[Fig. 8]
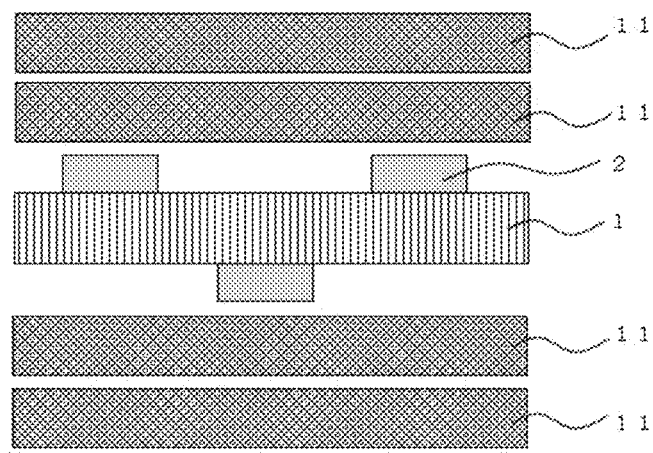

[Fig. 9]
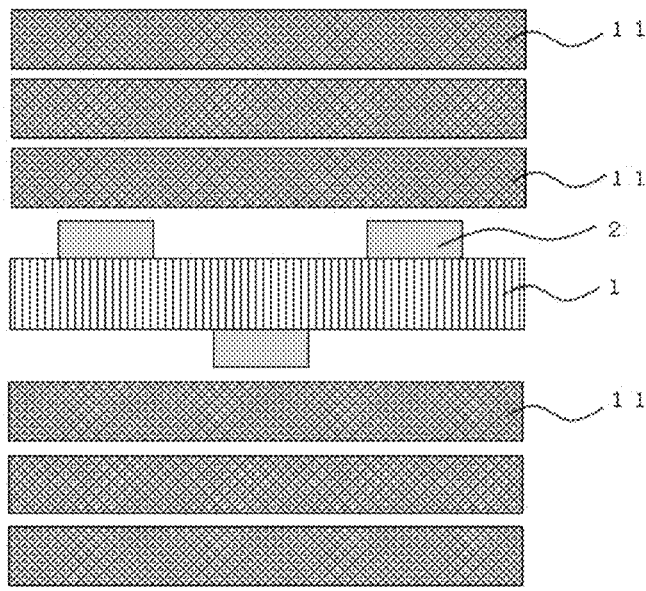
[Fig. 10]
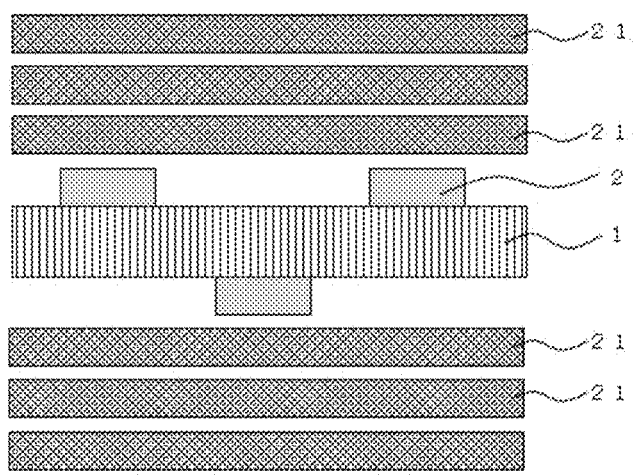

[Fig. 11]
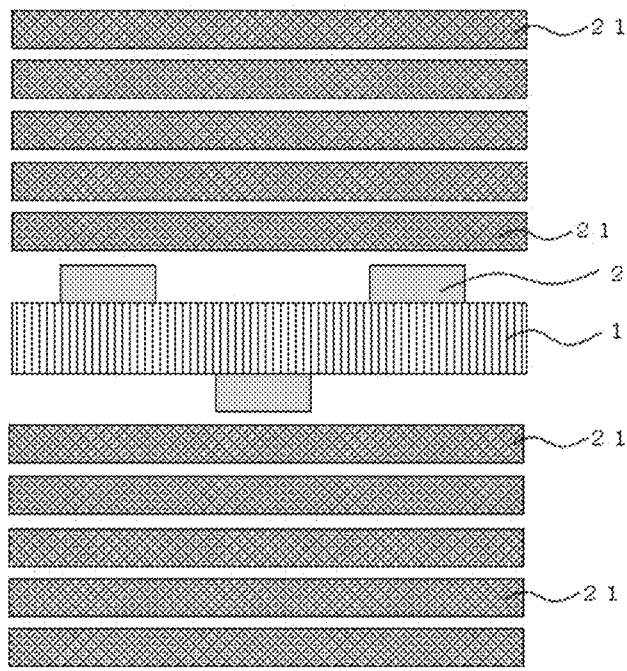
[Fig. 12]
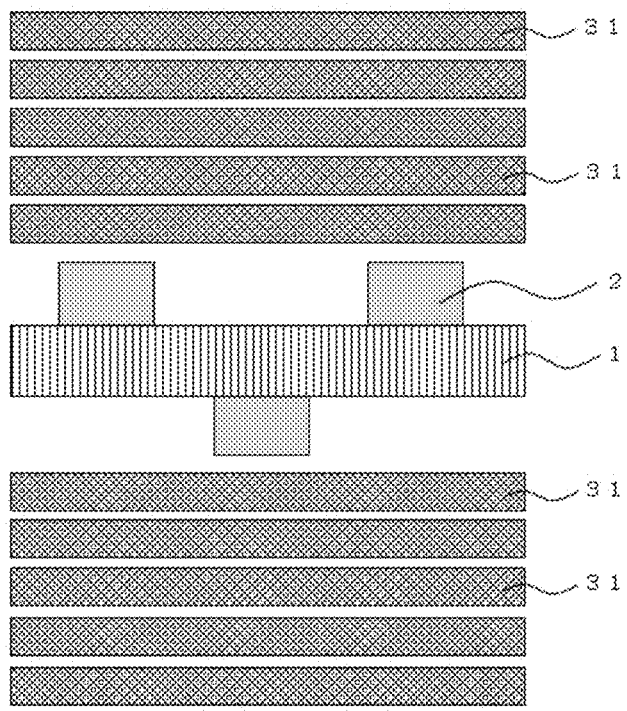

[Fig. 13]
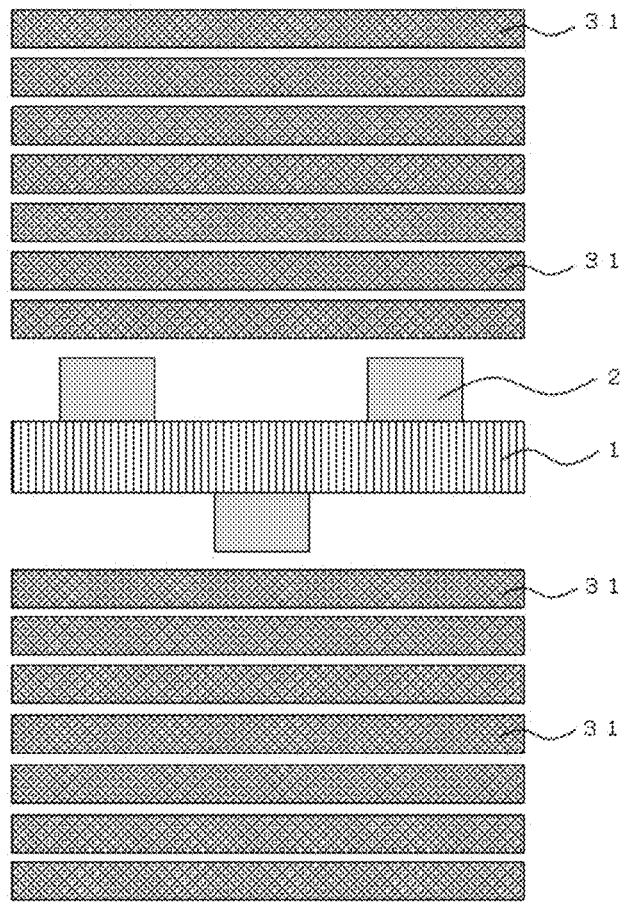
[Fig. 14]
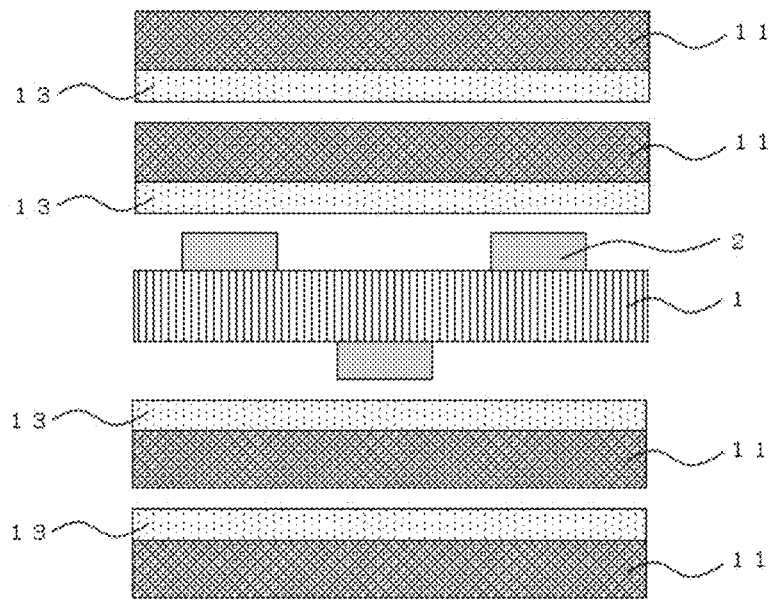

PREPREG, PRINTED CIRCUIT BOARD, SEMICONDUCTOR PACKAGE, AND METHOD FOR PRODUCING PRINTED CIRCUIT BOARD

CROSS-REFERENCE TO RELATED APPLICATIONS

This application is a U.S. national phase application filed under 35 U.S.C. § 371 of International Application No. PCT/JP2017/001133, filed Jan. 13, 2017, designating the United States, which claims benefit from Japanese Patent Application 2016-006478, filed Jan. 15, 2016, which are hereby incorporated herein by reference in their entirety.

TECHNICAL FIELD

The present invention relates to a prepreg, a printed circuit board, a semiconductor package, and a method for producing a printed circuit board.

BACKGROUND ART

Recently, against the background of environmental problems such as global warming, demands such as reduction of $CO_2$ and energy saving have been increasing. Accordingly, for example, hybrid engines, fuel cells, electric vehicles, and the like have been developed in the automobile field. Further, renewable energy such as solar cells and wind power generation has been promoted from the viewpoint of breaking with nuclear power generation.

In solar power generation, although the voltage during power generation is low, a high electric current may be generated in some cases. Further, in hybrid cars, electric vehicles and the like, high power has been used in an insulated gate bipolar transistor (IGBT) or the like. In particular, in a motor of a driving system of an automobile, a coil substrate or the like, which is reduced in size and weight by flowing a high electric current through several layers of coil circuits, has been used.

Since the circuit board used in these applications has a higher electric current flowing therethrough than that in a general electronic apparatus, it is necessary to increase a cross-sectional area of a conductor forming the circuit. Here, when the cross-sectional areas of the conductors are the same as each other, the electric resistance of the conductor becomes smaller as the cross-sectional shape thereof is closer to a circular shape, and becomes larger as the cross-sectional shape thereof is closer to a linear shape. Since the cross-sectional shape of the conductor of the printed circuit board is rectangular, the electric resistance of a conductor having the same thickness and circuit width becomes the smallest when the cross-sectional areas of the conductors are the same as each other. Accordingly, for a printed circuit board use, the thickness of the conductor needs to be increased in order to increase the cross-sectional area of the conductor.

However, in a circuit board having a large conductor thickness, the thickness greatly changes between the portion where the conductor is present and the portion where the conductor is not present, and as a result, when a prepreg or the like is laminated and used as an inner layer substrate, difficulty such as an occurrence of voids arises in the embeddability (hereinafter, also referred to as "moldability") of the inner layer circuit in some cases.

Examples of a method for improving the moldability include a method for laminating a large number of prepregs. However, according to this method, the thickness of the entire substrate becomes large, so that there occur problems in that the weight becomes heavy, and the heat dissipation properties of the substrate also deteriorate.

Further, examples of another method include a method for improving the embeddability of an inner layer circuit while suppressing the number of laminated prepregs to a small value by using a prepreg having an increased content of a resin component. However, since a resin component to adhere to a substrate, such as a glass cloth, sometimes falls off due to a weight thereof in some cases, there is a limit in a method for increasing the content of the resin component in the prepreg.

PTL 1 discloses a prepreg having a fiber substrate and resin layers on both surfaces of the fiber substrate as a prepreg capable of adjusting a resin amount according to a circuit pattern.

CITATION LIST

Patent Literature

PTL 1: JP 2011-68138 A

SUMMARY OF INVENTION

Technical Problem

When the prepreg disclosed in PTL 1 is applied to embed an inner layer circuit having a large conductor thickness, it is necessary to increase the thickness of the resin layer. However, when the thickness of the resin layer is increased, cracks are likely to occur on the resin layer due to deformation when the prepreg is lifted up during an operation such as a multilayering lamination process. Accordingly, the resin is peeled off from the prepreg, which is more apt to cause defects such as dents. Therefore, the technology of PTL 1 was not effective for an inner layer circuit having a large conductor thickness.

The present invention has been made to solve such problems, and an object of the present invention is to provide a prepreg having an excellent handling property and excellent moldability, which exhibits good embeddability even for an inner layer circuit having a large conductor thickness, a printed circuit board using the prepreg, a semiconductor package, and a method for producing a printed circuit board.

Solution to Problem

As a result of intensive studies to solve the problems, the present inventors have found that the problems may be solved by using a prepreg including two or more fiber substrate layers and one or more resin composition layers, in which at least one of the one or more resin composition layers has a fiber substrate layer on each of both surfaces thereof, thereby completing the present invention.

That is, the present invention provides the following [1] to [9].

[1] A prepreg including two or more fiber substrate layers and one or more resin composition layers,
in which at least one of the one or more resin composition layers has a fiber substrate layer on each of both surfaces thereof.

[2] The prepreg described in [1], in which when a thickness of the resin composition layer having a fiber substrate layer on each of both surfaces thereof is defined as $T_A$, and a thickness of a fiber substrate layer having a smaller thickness among the fiber substrate layers on both surfaces of the resin composition layer is defined as $T_B$, a ratio $[T_A/T_B]$ of $T_A$ and $T_B$ is from 0.25 to 5.

[3] The prepreg described in [1] or [2], in which the fiber substrate layer includes glass cloth as a fiber substrate.

[4] The prepreg described in any one of [1] to [3], in which the resin composition layer has a thickness of 10 to 200 μm.

[5] The prepreg described in any one of [1] to [4], further including a metal foil.

[6] A printed circuit board including a cured product of the prepreg described in any one of [1] to [5].

[7] The printed circuit board described in [6], including the printed circuit board includes a cured product of the prepreg described in any one of [1] to [5] and a circuit board, wherein the circuit board has a conductor circuit layer having a thickness of 60 μm or more, and the conductor circuit layer is in a state of being embedded by the cured product of the prepreg.

[8] A semiconductor package including the printed circuit board described in [6] or [7].

[9] A method for producing a printed circuit board, including laminate-molding the prepreg described in any one of [1] to [5] and a circuit board, which has a conductor circuit layer having a thickness of 60 μm or more, in a state where the prepreg and the conductor circuit layer face each other.

Advantageous Effect of Invention

According to the present invention, it is possible to provide a prepreg having an excellent handling property and excellent moldability, which exhibits good embeddability even for an inner layer circuit having a large conductor thickness, a printed circuit board using the prepreg, a semiconductor package, and a method for producing a printed circuit board.

BRIEF DESCRIPTION OF DRAWINGS

FIG. 1 is a schematic cross-sectional view illustrating a prepreg relating to an exemplary embodiment (Example 1) of the present invention.

FIG. 2 is a schematic cross-sectional view illustrating the definition of the thickness in the prepreg of the present invention.

FIG. 3 is a conceptual view illustrating a laminating order at the time of producing a printed circuit board in Example 1.

FIG. 4 is a schematic cross-sectional view illustrating a prepreg relating to an exemplary embodiment (Example 2) of the present invention.

FIG. 5 is a conceptual view illustrating a laminating order at the time of producing a printed circuit board in Example 2.

FIG. 6 is a schematic cross-sectional view illustrating a prepreg relating to an exemplary embodiment (Example 3) of the present invention.

FIG. 7 is a conceptual view illustrating a laminating order at the time of producing a printed circuit board in Example 3.

FIG. 8 is a conceptual view illustrating a laminating order at the time of producing a printed circuit board in Comparative Example 1.

FIG. 9 is a conceptual view illustrating a laminating order at the time of producing a printed circuit board in Comparative Example 2.

FIG. 10 is a conceptual view illustrating a laminating order at the time of producing a printed circuit board in Comparative Example 3.

FIG. 11 is a conceptual view illustrating a laminating order at the time of producing a printed circuit board in Comparative Example 4.

FIG. 12 is a conceptual view illustrating a laminating order at the time of producing a printed circuit board in Comparative Example 5.

FIG. 13 is a conceptual view illustrating a laminating order at the time of producing a printed circuit board in Comparative Example 6.

FIG. 14 is a conceptual view illustrating a laminating order at the time of producing a printed circuit board in Comparative Example 7.

DESCRIPTION OF EMBODIMENTS

Hereinafter, exemplary embodiments of the prepreg of the present invention will be described with reference to the drawings.

In the following description, the same or equivalent parts are denoted by the same reference numerals, and a repeated description will be omitted. Further, the positional relationships such as up, down, left, and right are based on the positional relationships illustrated in the drawings unless otherwise specifically mentioned. In addition, the dimensional ratios of the drawings are not limited to the illustrated ratios.

[Prepreg]

A prepreg of the present invention includes two or more fiber substrate layers and one or more resin composition layers, in which at least one of the one or more resin composition layers has a fiber substrate layer on each of both surfaces thereof.

Since the prepreg of the present invention includes the resin composition layer having a fiber substrate layer on each of both surfaces thereof, even in the case where the prepreg is applied to an inner layer circuit having a large conductor thickness, the resin composition in the prepreg may satisfactorily embed the inner layer circuit through the fiber substrate. Further, since the two or more fiber substrate layers serve as a reinforcing material, the prepreg of the present invention also has an excellent handling property.

In addition, the prepreg of the present invention may also be said to be a prepreg having two or more fiber substrates. Accordingly, since the fiber substrate functions as a reinforcing material, the prepreg of the present invention has an excellent handling property. Furthermore, in this case, the resin composition exists between the fiber substrates, satisfactorily embedding the circuit.

(Fiber Substrate Layer)

The prepreg of the present invention has two or more fiber substrate layers.

The number of fiber substrate layers included in the prepreg of the present invention may be two or more, and may be, for example, two to ten, or three to five.

The fiber substrate layer is a layer including a fiber substrate, and further, preferably includes a thermosetting resin composition. Further, in the present specification, the thermosetting resin composition included in the fiber substrate layer is referred to as "Resin Composition (I)" in some cases.

(Fiber Substrate)

As a fiber substrate, well-known ones used for laminates for various electrical insulating materials may be used. Examples of a material for the fiber substrate include: natural fiber such as paper and cotton linters; inorganic fiber such as glass fiber and asbestos; organic fiber such as aramid, polyimide, polyvinyl alcohol, polyester, tetrafluoroethylene and acrylic; mixtures thereof and the like.

As the fiber substrate, glass cloth is preferred from the viewpoint of flame retardancy. Examples of the glass cloth include: glass cloth using E-glass, C-glass, D-glass, S-glass or the like; glass cloth in which short fiber is bonded with an organic binder; glass cloth in which glass fiber is mixed with cellulose fiber; and the like. Among them, the glass cloth using E glass is preferred.

These fiber substrates have a shape of a woven fabric, a non-woven fabric, a roving, a chopped strand mat, a surfacing mat, and the like. Further, materials and shapes thereof are selected according to the use and performance of a target molded article, and one type may be used alone, or two or more types of materials and shapes may also be combined, if necessary.

The materials and the shapes of the respective fiber substrates included in the two or more fiber substrate layers may be the same as or different from each other.

[Resin Composition (I)]

Resin Composition (I) is a thermosetting resin composition included in the fiber substrate layer.

Resin Composition (I) at least contains a thermosetting resin. In addition to the thermosetting resin, Resin Composition (I) may contain a curing agent, a curing accelerator, an inorganic filler, an organic filler, a coupling agent, a leveling agent, an antioxidant, a flame retardant, a flame retardant aid, a thixotropy-imparting agent, a thickener, a thixotropy-imparting agent, a flexible material, a surfactant, a photopolymerization initiator, and the like, if necessary, and it is preferred that Resin Composition (I) contains at least one selected from the agents.

The compositions of Resin Compositions (I) included in the two or more fiber substrate layers may be the same as or different from each other.

Hereinafter, each component contained in Resin Composition (I) will be described in order.

(Thermosetting Resin)

Examples of a thermosetting resin include an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, a melamine resin, and the like. In addition, the thermosetting resin is not particularly limited thereto, and a well-known thermosetting resin may be used. These thermosetting resins may be used either alone or in combination of two or more thereof. Among them, an epoxy resin is preferred from the viewpoint of moldability and electrical insulation properties.

Examples of the epoxy resin include a cresol novolac type epoxy resin, a phenol novolac type epoxy resin, a naphthol novolac type epoxy resin, an aralkyl novolac type epoxy resin, a biphenyl novolac type epoxy resin, a bisphenol A type epoxy resin, a bisphenol F type epoxy resin, a bisphenol S type epoxy resin, a bisphenol T type epoxy resin, a bisphenol Z type epoxy resin, a tetrabromobisphenol A type epoxy resin, a biphenyl type epoxy resin, a tetramethylbiphenyl type epoxy resin, a triphenyl type epoxy resin, a tetraphenyl type epoxy resin, a naphthol aralkyl type epoxy resin, a naphthalenediol aralkyl type epoxy resin, a naphthol aralkyl type epoxy resin, a fluorene type epoxy resin, an epoxy resin having a dicyclopentadiene skeleton, an epoxy resin having an ethylenically unsaturated group in the skeleton, an alicyclic type epoxy resin, and the like.

Further, a halogenated epoxy resin may also be used as the epoxy resin from the viewpoint of flame retardancy. As the epoxy resin, one type may be used alone, and two or more types may be used in combination from the viewpoint of insulation reliability and heat resistance properties.

Examples of a commercially available product of the epoxy resin include "EPICLON (registered trademark) N-660" (manufactured by DIC Corporation) which is a cresol novolac type epoxy resin, "EPICLON (registered trademark) N-770" (manufactured by DIC Corporation) which is a phenol novolac type epoxy resin, "EPICLON (registered trademark) 840S" (manufactured by DIC Corporation) and "jER828EL" and "YL980" (both manufactured by Mitsubishi Chemical Corporation), which are bisphenol A type epoxy resins, and the like.

(Curing Agent)

When the thermosetting resin is an epoxy resin, examples of a curing agent include a curing agent for an epoxy resin, such as a phenol-based curing agent, a cyanate ester-based curing agent, an acid anhydride-based curing agent, an amine-based curing agent, and an active ester group-containing compound. Further, when the thermosetting resin is a resin other than the epoxy resin, a well-known curing agent may be used as the curing agent for the thermosetting resin. The curing agents may be used either alone or in combination of two or more thereof.

The phenol-based curing agent is not particularly limited, but preferred examples thereof include a cresol novolac type curing agent, a biphenyl type curing agent, a phenol novolac type curing agent, a naphthylene ether type curing agent, a triazine skeleton-containing phenol-based curing agent, and the like.

Examples of a commercially available product of the phenol-based curing agent include: a cresol novolac type curing agent such as KA-1160, KA-1163, and KA-1165 (all manufactured by DIC Corporation); a biphenyl type curing agent such as MEH-7700, MEH-7810, and MEH-7851 (all manufactured by Meiwa Plastic Industries, Ltd.); a phenol novolac type curing agent such as Phenolite (registered trademark) TD2090 (manufactured by DIC Corporation); a naphthylene ether type curing agent such as EXB-6000 (manufactured by DIC Corporation); a triazine skeleton-containing phenol-based curing agent such as LA3018, LA7052, LA7054, and LA1356 (all manufactured by DIC Corporation); and the like.

The cyanate ester-based curing agent is not particularly limited, but examples thereof include bisphenol A dicyanate, polyphenol cyanate (oligo (3-methylene-1,5-phenylene cyanate), 4,4'-methylenebis(2,6-dimethyl phenyl cyanate), 4,4'-ethylidene diphenyl dicyanate, hexafluorobisphenol A dicyanate, 2,2-bis(4-cyanate)phenyl propane, 1,1-bis(4-cyanate phenyl methane), bis(4-cyanate-3,5-dimethylphenyl) methane, 1,3-bis(4-cyanatephenyl-1-(methylethylidene)) benzene, bis(4-cyanatephenyl)thioether, bis(4-cyanatephenyl)ether, and the like.

The acid anhydride-based curing agent is not particularly limited, but examples thereof include phthalic anhydride, tetrahydrophthalic anhydride, hexahydrophthalic anhydride, methyltetrahydrophthalic anhydride, methylhexahydrophthalic anhydride, methylnadic anhydride, hydrogenated methylnadic anhydride, trialkyltetrahydrophthalic anhydride, dodecenylsuccinic anhydride, 5-(2,5-dioxotetrahydro-3-furanyl)-3-methyl-3-cyclohexene-1,2-dicarboxylic anhydride, trimellitic anhydride, pyromellitic anhydride, and the like.

The amine-based curing agent is not particularly limited, but examples thereof include: aliphatic amines such as triethylenetetramine, tetraethylenepentamine, and diethylaminopropylamine; aromatic amines such as meta-phenylenediamine and 4,4'-diaminodiphenylmethane; and the like.

Further, as the curing agent, a urea resin or the like may also be used.

When Resin Composition (I) contains a curing agent, the content thereof is preferably 20 to 150 parts by mass, more preferably 30 to 120 parts by mass, and even more preferably 40 to 100 parts by mass, based on 100 parts by mass of the thermosetting resin.

Further, when the thermosetting resin composition contains a curing agent, the content thereof may be expressed by using a functional group equivalent weight, and it is preferred to do so. Specifically, it is preferred that the thermosetting resin composition contains a curing agent so as to be (a mass of a thermosetting resin/a functional group equivalent weight)≈(a mass of a curing agent/a functional group equivalent weight capable of reacting with the thermosetting resin)×constant C. The constant C varies depending on the type of functional group of the curing agent, and is preferably 0.8 to 1.2 when the functional group is a phenolic hydroxyl group, preferably 0.2 to 0.4 when the functional group is an amino group, and preferably 0.3 to 0.6 when the functional group is an active ester group.

When the thermosetting resin is an epoxy resin, the above equation is (a mass of an epoxy resin/an equivalent weight of an epoxy group)≈(a mass of a curing agent/a functional group equivalent weight capable of reacting with the epoxy group)×constant C.

(Curing Accelerator)

As the curing accelerator, a general curing accelerator used for curing the thermosetting resin may be used. For example, when the thermosetting resin is an epoxy resin, examples of the curing accelerator include: an imidazole compound and derivatives thereof a phosphorus-based compound; a tertiary amine compound; a quaternary ammonium compounds; and the like. Among them, an imidazole compound and a derivative thereof are preferred from the viewpoint of accelerating the curing reaction.

Specific examples of the imidazole compound and the derivatives thereof include: an imidazole compound such as 2-methylimidazole, 2-ethylimidazole, 2-undecylimidazole, 2-heptadecylimidazole, 2-phenylimidazole, 1,2-dimethylimidazole, 2-ethyl-1-methylimidazole, 1,2-diethylimidazole, 1-ethyl-2-methylimidazole, 2-ethyl-4-methylimidazole, 4-ethyl-2-methylimidazole, 1-isobutyl-2-methylimidazole, 2-phenyl-4-methylimidazole, 1-benzyl-2-phenylimidazole, 1-cyanoethyl-2-methylimidazole, 1-cyanoethyl-2-ethylimidazole, 1-cyanoethyl-2-phenylimidazole, 1-cyanoethyl-2-ethyl-4-methylimidazole, 2-phenyl-4,5-dihydroxymethylimidazole, 2-phenyl-4-methyl-5-hydroxymethylimidazole, 2,3-dihydro-1H-pyrrolo[1,2-a]benzimidazole, 2,4-diamino-6-[2'-methylimidazolyl-(1')]ethyl-s-triazine, 2,4-diamino-6-[2'-undecylimidazolyl-(1')]ethyl-s-triazine, and 2,4-diamino-6-[2'-ethyl-4'-methylimidazolyl-(1')]ethyl-s-triazine; a salt of the imidazole compound and trimellitic acid, such as 1-cyanoethyl-2-phenylimidazolium trimellitate; a salt of the imidazole compound and isocyanuric acid; a salt of the imidazole compound and hydrobromic acid; and the like. The imidazole compound and the derivatives thereof may be used either alone or in combination of two or more thereof.

When Resin Composition (I) contains a curing accelerator, the content thereof is preferably 0.1 to 20 parts by mass, more preferably 0.3 to 10 parts by mass, and even more preferably 0.5 to 6 parts by mass, based on 100 parts by mass of the thermosetting resin.

(Inorganic Filler)

By an inorganic filler, it is possible to reduce the thermal expansion coefficient and to improve the strength of a coating film.

Examples of the inorganic filler include silica, alumina, barium sulfate, talc, mica, kaolin, boehmite, beryllia, barium titanate, potassium titanate, strontium titanate, calcium titanate, aluminum carbonate, magnesium hydroxide, aluminum hydroxide, aluminum borate, aluminum silicate, calcium carbonate, calcium silicate, magnesium silicate, zinc borate, zinc stannate, aluminum oxide, zirconia, mullite, magnesia, zinc oxide, titanium oxide, silicon carbide, silicon nitride, boron nitride, clay such as calcined clay, short glass fiber, glass powder and hollow glass beads, and the like, and at least one selected from the group consisting of the examples is preferably used. Preferred examples of the glass include E glass, T glass, D glass, and the like. Among them, silica and alumina are preferred and silica is more preferred, from the viewpoints of reduction in the thermal expansion coefficient and reduction in relative dielectric constant and dielectric loss tangent.

Examples of the silica include precipitated silica produced by a wet process and having a high water content, and dry process silica produced by a dry process and hardly containing bound water, or the like. Examples of the dry process silica also include crushed silica, fumed silica, fused silica (fused spherical silica) depending on the production method.

The inorganic filler may be subjected to a surface treatment with a surface treatment agent such as a silane coupling agent in order to improve moisture resistance, or may be subjected to a hydrophobic treatment in order to improve dispersibility.

The inorganic filler may be appropriately selected depending on the purpose. A specific surface area of the inorganic filler is preferably 20 $m^2/g$ or more, more preferably 30 to 250 $m^2/g$, and even more preferably 100 to 250 $m^2/g$, from the viewpoint of facilitating the formation of fine wiring. The specific surface area of the inorganic filler may be obtained by a measuring method ordinarily performed by a person skilled in the art, and may be measured by, for example, the BET method. The BET method is a method of adsorbing molecules whose adsorption occupied area is known onto the surface of powder particles at the temperature of liquid nitrogen and obtaining the specific surface area of the sample from the amount. The BET method by an inert gas such as nitrogen is most frequently used in the specific surface area analysis.

As the inorganic filler, it is preferred to contain an inorganic filler having an average primary particle diameter of 100 nm or less (hereinafter, also referred to as "Inorganic Filler (1)"). The average primary particle diameter of Inorganic Filler (1) is preferably 1 to 80 nm, more preferably 3 to 50 nm, and even more preferably 5 to 30 nm. Here, the "average primary particle diameter" refers not to an average diameter of aggregated particles, that is, a secondary particle diameter, but to an average particle diameter of a single substance which is not aggregated. The primary average particle diameter may be obtained by measurement with a laser diffraction type particle size distribution meter. Further, the average primary particle diameter is a particle diameter at a point equivalent to a volume of 50% when a cumulative frequency distribution curve based on a particle diameter is obtained with a total volume of the particles taken as 100%.

Examples of a commercially available product of Inorganic Filler (1) include: AEROSIL 200 (specific surface area=200±25 m$^2$/g, average primary particle diameter ≈15 to 16 nm, catalog value), AEROSIL R972 (specific surface area=110±20 m$^2$/g, average primary particle diameter ≈16 nm, catalog value), and AEROSIL R202 (specific surface area=100±20 m$^2$/g, average primary particle diameter ≈14 nm, catalog value) [all manufactured by Nippon Aerosil Co., Ltd., trade name]; PL-1 (specific surface area=181 m$^2$/g, average primary particle diameter=15 nm, catalog value) and PL-7 (specific surface area=36 m$^2$/g, average primary particle diameter=75 nm, catalog value) [all manufactured by Fuso Chemical Co., Ltd., trade name]; AL-A06 (specific surface area=55 m$^2$/g, catalog value) [manufactured by CIK Nanotech Co., Ltd., trade name]; and the like.

As the inorganic filler, Resin Composition (1) may also contain an inorganic filler (hereinafter, also referred to as "Inorganic Filler (2)") having an average primary particle size of more than 0.1 μm and 50 μm or less together with Inorganic Filler (1). An average primary particle diameter of Inorganic Filler (2) is preferably 0.2 to 30 μm, more preferably 0.4 to 15 μm, and even more preferably 0.5 to 7 μm.

Examples of a commercially available product of Inorganic Filler (2) include SO—C1 (spherical silica, specific surface area=17 m$^2$/g, average primary particle size=0.2 to 0.3 μm, manufactured by Admatechs Corporation), FB-3SDC (fused silica, average primary particle diameter=3.4 μm, manufactured by Denki Kagaku Kogyo Co., Ltd.), and the like.

When Resin Composition (I) contains an inorganic filler, the content thereof is preferably 1 to 70% by mass, more preferably 20 to 65% by mass, and even more preferably 40 to 63% by mass, based on all the components of Resin Composition (I) (however, the organic solvent is excluded). When the content thereof is 70% by mass or less, the viscosity of Resin Composition (I) may be kept low, so that the workability is improved. Further, it is possible to suppress the adhesive strength from being reduced.

In addition, when Resin Composition (I) contains Inorganic Filler (1), the content thereof is preferably 0.05 to 2% by mass, more preferably 0.1 to 1% by mass, and even more preferably 0.15 to 0.4% by mass, based on all the components of Resin Composition (I) (however, the organic solvent is excluded).

Furthermore, since the inorganic filler is present in a wide range from a small specific gravity to a large specific gravity as compared to the resin component, the content (% by mass) may be expressed by being converted into "% by volume" to which the specific gravity is added. That is, although the content of the inorganic filler varies depending on the purpose of addition, it can be said that the content thereof is preferably 0.1 to 65% by volume. For coloring and impermeability purposes, when the content thereof is 0.1% by volume or more, the effect is apt to be sufficiently exhibited. Meanwhile, when the inorganic filler is added for the purpose of increasing the amount, the reduction in adhesive strength is apt to be suppressed by suppressing the content thereof to 65% by volume or less, and the viscosity at the time of blending the resin components does not become excessively high, so that the deterioration in workability is apt to be suppressed. From the same viewpoint, the content of the inorganic filler is more preferably 10 to 60% by volume and more preferably 25 to 50% by volume.

(Coupling Agent)

By containing a coupling agent, there are effects of improving the dispersibility of an inorganic filler and an organic filler and improving the adhesion to a reinforcing substrate and a metal foil. The curing agents may be used either alone or in combination of two or more thereof.

As the coupling agent, a silane-based coupling agent is preferred. Examples of the silane coupling agent include an aminosilane-based coupling agent [for example, 3-aminopropyltrimethoxysilane, N-(2-aminoethyl)-3-aminopropyltriethoxysilane, and the like], an epoxysilane-based coupling agent [for example, 3-glycidoxypropyltrimethoxysilane, 2-(3,4-epoxycyclohexyl)ethyltrimethoxysilane, and the like], a phenylsilane-based coupling agent, an alkylsilane-based coupling agent, an alkenylsilane-based coupling agent [for example, a vinylsilane-based coupling agent such as vinyltrichlorosilane and vinyltriethoxysilane], an alkynylsilane-based coupling agent, a haloalkylsilane-based coupling agent, a siloxane-based coupling agent, a hydrosilane-based coupling agent, a silazane-based coupling agent, an alkoxysilane-based coupling agent, a chlorosilane-based coupling agent, a (meth) acrylsilane-based coupling agent, an aminosilane-based coupling agent, an isocyanurate silane-based coupling agent, an ureido silane-based coupling agent, a mercapto silane-based coupling agent, a sulfide silane-based coupling agent, an isocyanate silane-based coupling agent, and the like. Among them, an epoxysilane-based coupling agent is preferred.

Further, it is also possible to use a so-called titanate-based coupling agent in which a silane moiety of a silane-based coupling agent is substituted with titanate.

When Resin Composition (I) contains a coupling agent, the content thereof is preferably 0.1 to 20 parts by mass, more preferably 0.3 to 10 parts by mass, and even more preferably 0.5 to 6 parts by mass, based on 100 parts by mass of the thermosetting resin.

(Organic Solvent)

From the viewpoint of facilitating handling, Resin Composition (I) may also contain an organic solvent.

The organic solvent is not particularly limited, but examples thereof include: an alcohol-based solvent such as methanol, ethanol, propanol, butanol, methyl cellosolve, butyl cellosolve, propylene glycol monomethyl ether, ethylene glycol monoethyl ether, dipropylene glycol monomethyl ether, dipropylene glycol monoethyl ether, and tripropylene glycol monomethyl ether; a ketone-based solvent such as acetone, methyl ethyl ketone, methyl isobutyl ketone, butanone, cyclohexanone, and 4-methyl-2-pentanone; an ester-based solvent such as ethyl acetate, butyl acetate, and propylene glycol monomethyl ether acetate; an ether-based solvent such as tetrahydrofuran; an aromatic solvent such as toluene, xylene, and mesitylene; a nitrogen atom-containing solvent such as N,N-dimethylformamide, N, N-dimethylacetamide, and N-methylpyrrolidone; a sulfur atom-containing solvent such as dimethyl sulfoxide; and the like. Among them, a ketone-based solvent is preferred, cyclohexanone, methyl ethyl ketone, and methyl isobutyl ketone are more preferred, and cyclohexanone and methyl ethyl ketone are even more preferred, from the viewpoints of solubility and appearance after coating.

The organic solvents may be used either alone or in combination of two or more thereof.

When Resin Composition (I) contains an organic solvent, for the content thereof, from the viewpoint of ease of application, the amount of organic solvent used is adjusted such that the nonvolatile content of Resin Composition (I) is preferably 20 to 85% by mass and more preferably 40 to 80% by mass.

Meanwhile, when there is no problem in terms of characteristics, a powder mixing may be adopted in which the respective components are mixed as a powder phase without using an organic solvent, or an aqueous solution such as a suspension may be used. Further, the respective components may be directly stirred and mixed at a temperature at which the curing of Resin Composition (I) does not significantly proceed and at a temperature at which Resin Composition (I) is liquefied.

[Method for Preparing Resin Composition (I)]

The method for preparing Resin Composition (I) is not particularly limited, and a well-known preparation method in the related art may be adopted.

For example, Resin Composition (I) may be prepared by adding a thermosetting resin and, if necessary, other components to the organic solvent, and then mixing and stirring the resulting mixture using various mixers. Examples of the mixer include an ultrasonic dispersion type mixer, a high pressure collision type dispersion type mixer, a high-speed rotation dispersion type mixer, a bead mill type mixer, a high speed shearing dispersion type mixer, a rotation revolution type dispersion type mixer, and the like.

(Method for Producing Fiber Substrate Layer)

A fiber substrate layer may be produced, for example, by impregnating a fiber substrate with Resin Composition (I) or applying Resin Composition (I) onto a fiber substrate, and then semi-curing (B-staging) Resin Composition (I) by heating or the like.

Since it is preferred that the semi-curing (B-staging) is performed simultaneously with a process of removing the organic solvent, as a heating temperature at the time of semi-curing (B-staging) Resin Composition (I), a temperature equal to or more than the boiling point of the organic solvent having good removal efficiency of the organic solvent is preferred. Specifically, the heating temperature is preferably 80 to 200° C., and more preferably 140 to 180° C. Further, in the present invention, a prepreg obtained by semi-curing (B-staging) Resin Composition (I) is recognized as an uncured prepreg, and a C-staged prepreg is recognized as a cured prepreg after the curing.

Examples of another method for producing the fiber substrate layer include a method of applying Resin Composition (I) onto a release film, and then semi-curing (B-staging) Resin Composition (I) by heating or the like to form Resin Composition (I) in the form of a film (hereinafter, also referred to as "Resin Film (I)"), and laminating Resin Film (I) on the fiber substrate.

For application of Resin Composition (I), it is possible to use a well-known coating machine such as a die coater, a comma coater, a bar coater, a kiss coater, and a roll coater. These coating machines may be appropriately selected depending on the desired thickness of the resin film.

As a method of lamination, for example, a method of lamination to a fiber substrate under reduced pressure by a vacuum lamination method is suitably used.

Examples of the release film include: an organic film such as polyethylene terephthalate (PET), biaxially oriented polypropylene (OPP), polyethylene, polyvinyl fluorate, and polyimide; a film of copper, aluminum, and an alloy of these metals; a film in which the surface of the organic film or the metal film is subjected to a release treatment with a releasing agent; and the like.

The content of Resin Composition (I) in the fiber substrate layer is preferably 30 to 90% by mass, more preferably 40 to 85% by mass, and even more preferably 50 to 80% by mass, from the viewpoint of moldability and workability.

(Resin Composition Layer)

The prepreg of the present invention has one or more resin composition layers.

At least one of the one or more resin composition layers has a fiber substrate layer on each of both surfaces thereof.

The number of resin composition layers having a fiber substrate layer on each of both surfaces thereof may be one layer or more, for example, two layers to ten layers, and three layers to five layers.

The resin composition layer is a layer including a resin composition, examples of the respective components constituting the resin composition include those which are the same as the respective components constituting Resin Composition (I) included in the fiber substrate layer, and preferred aspects thereof are also the same.

Further, in the present specification, the resin composition included in the resin composition layer is referred to as "Resin Composition (II)" in some cases.

(Thickness of Each Layer)

Next, thicknesses of the fiber substrate layer and the resin composition layer will be described with reference to FIG. 2.

As illustrated in FIG. 2, in the prepreg of the present invention, the thickness of the fiber substrate layer means a thickness of a layer in which glass cloth exists at any one place in a plane direction of the prepreg (direction A in FIG. 2) in the cross section of the prepreg. That is, in FIG. 2, the thickness of the fiber substrate layer is defined as the thicknesses $T_{B1}$ and $T_{B2}$.

In addition, in the prepreg of the present invention, the thickness of the resin composition layer means a thickness of a layer in which glass cloth does not exist at any place in a plane direction of the prepreg (direction A in FIG. 2) in the cross section of the prepreg. That is, in FIG. 2, the thickness of the resin composition layer is defined as the thickness $T_A$.

The thicknesses of the fiber substrate layer and the resin composition layer may be obtained, for example, by observing the cross section of the prepreg, measuring the thickness of the fiber substrate layer at 10 places within a 1 inch (25.4 mm) range in a plane direction (direction A in FIG. 2) of the arbitrarily selected prepreg, and averaging the measured values. The cross section of the prepreg may be observed, for example, by producing a cross section of the prepreg by a well-known method such as mechanical polishing and ion polishing, and using a scanning electron microscope (SEM).

The thickness of the fiber substrate layer in the prepreg of the present invention may be appropriately adjusted according to the thickness of the inner layer circuit, and the like, but is preferably 10 to 300 μm, more preferably 30 to 200 μm, and even more preferably 50 to 150 μm, from the viewpoint of moldability and workability.

The thicknesses of the two or more fiber substrate layers may be the same as or different from each other.

The thickness of the resin composition layer in the prepreg of the present invention may be appropriately adjusted according to the thickness of the inner layer circuit, and the like, but is preferably 10 to 200 μm, more preferably 20 to 150 μm, and even more preferably 30 to 100 μm, from the viewpoint of moldability and workability.

When the prepreg of the present invention has two or more resin composition layers, the thicknesses of the two or more resin composition layers may be the same as or different from each other.

When the thickness of the resin composition layer having a fiber substrate layer on each of both surfaces thereof is defined as $T_A$ and the thickness of a fiber substrate layer having a smaller thickness among the fiber substrate layers on both surfaces of the resin composition layer is defined as $T_B$, the ratio $[T_A/T_B]$ of $T_A$ and $T_B$ is preferably 0.25 to 5, more preferably 0.4 to 3.5, and even more preferably 0.5 to 2, from the viewpoint of moldability and workability.

The thickness of the prepreg of the present invention may be appropriately adjusted according to the thickness of the inner layer circuit, and the like, but is preferably 50 to 1,000 μm, more preferably 100 to 700 μm, and even more preferably 200 to 500 μm, from the viewpoint of moldability and workability.

In the prepreg of the present invention, a proportion occupied by a total volume of the fiber substrate layer is preferably 50 to 90% by volume, more preferably 55 to 85% by volume, and even more preferably 60 to 80% by volume, from the viewpoint of moldability and workability.

In the prepreg of the present invention, a proportion occupied by a total volume of the resin composition layer is preferably 10 to 50% by volume, more preferably 15 to 45% by volume, and even more preferably 20 to 40% by volume, from the viewpoint of moldability and workability.

(Method for Producing Prepreg)

Next, a method for producing the prepreg of the present invention will be described by taking a prepreg 100 illustrated in FIG. 1 as an example.

The prepreg 100 has a fiber substrate layer 11, a resin composition layer 13, and a fiber substrate layer 12 in this order.

The prepreg 100 may be produced, for example, by a method of forming the resin composition layer 13 by layer-forming Resin Composition (II) on one surface of the fiber substrate layer 11 produced by the above-described method, and forming the fiber substrate layer 12 on a surface of the resin composition layer 13 opposite to the fiber substrate layer 11.

Examples of the method of layer-forming Resin Composition (II) on one surface of the fiber substrate layer 11 include the following methods (1) to (3).

(1) A method (hereinafter, also referred to as "Method (1)") of applying Resin Composition (II) onto the fiber substrate layer 11 by using a coating machine, and then semi-curing (B-staging) Resin Composition (II) by heating, or the like.

(2) A method (hereinafter, also referred to as "Method (2)") of semi-curing (B-staging) Resin Composition (II) formed in the form of a film (hereinafter, also referred to as "Resin Film (II)"), and then performing adhesion of Resin Film (II) to the fiber substrate layer 11.

(3) A method (hereafter, also referred to as "Method (3)") of thickly forming Resin Composition (I) on only one surface of the fiber substrate layer 11 in advance at the time of producing the fiber substrate layer 11.

Among them, Method (2) is preferred from the viewpoint of workability and control of the curing degree of resin.

In the case of Method (1), the method and conditions described in the above (Method for Producing Fiber Substrate Layer) may be adopted as conditions for applying and semi-curing (B-staging) Resin Composition (II).

In the case of Method (2), Resin Film (II) used for forming the resin composition layer 13 is obtained by applying Resin Composition (II) onto, for example, the release film described in the above (Method for Producing Fiber Substrate Layer) using the coating machine, and semi-curing (B-staging) Resin Composition (II) by heating, or the like. The method and conditions described in the above (Method for Producing Fiber Substrate Layer) may be adopted as conditions for applying and semi-curing (B-staging) Resin Composition (II).

As a method of performing adhesion of Resin Film (II), a heat bonding method is preferred, for example, a continuous production method such as roll lamination may be used, or a batch type method such as a vacuum laminator may be used. The conditions for roll laminate range from, for example, a heating temperature of 50 to 150° C. and a pressure of 0.1 to 1.0 MPa/m.

The conditions for the vacuum laminator range from, for example, a heating temperature of 50 to 150° C., a pressing time of 10 to 120 seconds, and a pressure of 0.1 to 0.5 MPa.

In the case of Method (3), the fiber substrate layer 11 and the resin composition layer 13 may be formed by the method described in the above Method for Producing Fiber Substrate Layer.

Next, the prepreg 100 may be obtained by forming the fiber substrate layer 12 on the surface of the resin composition layer 13, which is formed by the above method, opposite to the fiber substrate layer 11.

Examples of a method for forming the fiber substrate layer 12 in the resin composition layer 13 include a method of performing adhesion of the fiber substrate layer 12 to the resin composition layer 13. As an adhering method, in Method (2), a method which is the same as the method of performing adhesion of Resin Film (II) to the fiber substrate layer may be applied.

In addition, examples of another method include a method of producing the fiber substrate layer 11 having the resin composition layer 13 formed on one surface thereof and the fiber substrate layer 12 having the resin composition layer 13 formed on one surface thereof and arranging and performing adhesion of the fiber substrate layers 11 and 12 such that the resin composition layers 13 face each other, and the like. For the adhesion, in Method (2), a method which is the same as the method of performing adhesion of a resin film to a fiber substrate layer may be applied.

The method for producing the prepreg of the present invention may be carried out by repeating the same process as described above or combining different methods depending on the intended constitution. Further, the same process may be carried out by changing the number of fiber substrate layers and resin composition layers to be used.

Next, an example having three or more fiber substrate layers will be described.

FIG. 4 is a cross-sectional view of a prepreg 200 which is an example of exemplary embodiments of the prepreg of the present invention.

The prepreg 200 has three fiber substrate layers 21, 22, and 23, and two resin composition layers 24 and 25.

The two resin composition layers 24 and 25 illustrated in FIG. 4 each have a fiber substrate layer on each of both surfaces thereof.

FIG. 6 is a cross-sectional view of a prepreg 300 which is an example of exemplary embodiments of the prepreg of the present invention.

The prepreg 300 has five fiber substrate layers 31, 32, 33, 34, and 35, and two resin composition layers 36 and 37.

The two resin composition layers 36 and 37 illustrated in FIG. 6 each have a fiber substrate layer on each of both surfaces thereof, and the fiber substrate layers 31 and 32 are adjacent to each other and the fiber substrate layers 34 and 35 are adjacent to each other, without interposing the resin composition layer therebetween.

When the prepreg of the present invention has three or more fiber substrate layers as in the prepreg 300, a fiber substrate layer adjacent to a fiber substrate layer may be present without interposing the resin composition layer therebetween.

Furthermore, the prepreg of the present invention may have a resin composition layer outside the outermost fiber substrate layer. Since the prepreg of the present invention includes a plurality of fiber substrate layers, warpage which occurs when a resin composition layer is formed on only one surface of one fiber substrate layer is difficult to occur, so that the resin composition layer is maintained well without falling out.

Further, the prepreg of the present invention may also have a metal foil. Examples of the metal foil include a metal foil such as copper, nickel, and 42 alloy, but a copper foil is preferred from the viewpoint of availability and price. The metal foil may be provided on at least one surface of the prepreg.

[Printed Circuit Board and Method for Producing the Same]

A printed circuit board of the present invention includes a cured product of the prepreg of the present invention.

It is preferred that the printed circuit board of the present invention includes a cured product of the prepreg of the present invention and a circuit board, the circuit board has a conductor circuit layer, and the conductor circuit layer is embedded by the cured product of the prepreg. That is, it is preferred that the printed circuit board of the present invention includes the conductor circuit layer of the circuit board as an inner layer circuit.

The circuit board is not particularly limited, and a board on which a circuit is formed by a well-known method may be used. The thickness of the conductor circuit layer of the circuit board is preferably 35 μm or more, more preferably 50 μm or more, and even more preferably 60 μm or more, from the viewpoint of more significantly exhibiting the effect of the present invention. Further, in the case of adapting the present invention to uses where a higher electric current flows, the thickness thereof may be 100 μm or more, 150 μm or more, or 180 μm or more. In addition, the thickness of the conductor circuit layer is preferably 500 μm or less, and more preferably 400 μm or less, from the viewpoint of embeddability of a circuit.

The printed circuit board of the present invention may be produced, for example, by laminate-molding the circuit board and the prepreg of the present invention. Specifically, the printed circuit board of the present invention may be produced by disposing the prepreg of the present invention on each of both surfaces of the circuit board, disposing a metal foil outside the prepreg, and heating and pressurizing the prepreg.

Examples of the metal foil include a metal foil such as copper, nickel, and 42 alloy, but a copper foil is preferred from the viewpoint of availability and price.

As molding conditions, for example, molding conditions applied to a method for producing a laminate and a multi-layered plate for an electrical insulating material may be applied, and the prepreg may be molded within ranges of a temperature of 100 to 250° C., a pressure of 0.2 to 10 MPa, and a heating time of 0.1 to 5 hours by using, for example, a multistage press, a multistage vacuum press, continuous molding, and an autoclave molding machine. These conditions may be determined within a range in which the prepreg is sufficiently cured.

[Semiconductor Package]

A semiconductor package of the present invention includes the printed circuit board of the present invention, and in more detail, is formed by mounting a semiconductor on the printed circuit board of the present invention. The semiconductor package of the present invention may be produced by mounting a semiconductor chip, a memory, or the like at a predetermined position of the printed circuit board of the present invention.

EXAMPLES

Next, the present invention will be explained in more detail with reference to the following Examples, but these Examples do not limit the present invention.

Example 1

Prepreg A having the configuration of the prepreg 100 illustrated in FIG. 1 was produced in the order shown below.

(Preparation of Thermosetting Resin Varnish A)

100 parts by mass of a phenol novolac type epoxy resin (manufactured by DIC Corporation, trade name: N-770), 30 parts by mass of a bisphenol A type epoxy resin (manufactured by DIC Corporation, trade name: EPICLON (registered trademark) 840S), 70 parts by mass of a phenol novolac resin (manufactured by DIC Corporation, trade name: Phenolite (registered trademark) TD2090), 35 parts by mass of cyclohexane, and 180 parts by mass of methyl ethyl ketone were blended and then sufficiently stirred to dissolve the resin components.

120 parts by mass of aluminum hydroxide (manufactured by Showa Denko K. K., trade name: HIGILITE (registered trademark) H-42), 180 parts by mass of silica (manufactured by Denki Kagaku Kogyo Co., Ltd., trade name: FB-3SDC), and 1 part by mass of nano silica (manufactured by Nippon Aerosil Co., Ltd., trade name: AEROSIL 200) as a filler, 3.2 parts by mass of an epoxy-based silane coupling agent (manufactured by Momentive Performance Materials Inc., trade name: A-187) as a coupling agent, and 1.8 parts by mass of isocyanate mask imidazole (manufactured by DKS Co., Ltd., trade name: G8009L) as a curing accelerator were added thereto and dissolved and dispersed by stirring the resulting mixture, thereby obtaining Thermosetting Resin Varnish A (content of silica and nano silica: 29% by volume, content of aluminum hydroxide: 17% by volume) having a nonvolatile component content of 70% by mass.

(Production of Prepreg)

Thermosetting Resin Varnish A was applied to glass cloth (manufactured by Nitto Boseki Co., Ltd., basis weight: 105 g/m$^2$, thickness: 96 μm, IPC style: 2116, and width: 530 mm) such that the content of the resin composition after drying was 58% by mass. Next, in order to remove the organic solvent and thermally cure the resin, heat curing was carried out by a hot air dryer at 160° C., and the curing degree was adjusted such that the gel time measured by a test method of No. 2. 3. 18 of IPC-TM-650 was 125±10 seconds, thereby obtaining Prepreg a1.

Next, Thermosetting Resin Varnish A was applied onto a PET film (manufactured by Teijin DuPont Co., Ltd., trade name: G-2) having a width of 580 mm. The application amount was adjusted such that the application width was 525 mm and the thickness of the resin composition layer after drying was 40 μm. Next, in order to remove the organic solvent and thermally cure the resin, heat curing was carried out by a hot air dryer at 140° C., and the curing degree was adjusted such that the gel time measured by a test method of No. 2. 3. 18 of IPC-TM-650 was 90±10 seconds, thereby obtaining Thermosetting Resin Film A.

A release aluminum foil (manufactured by Toyo Aluminum Chiba Co., Ltd., trade name: Sepanium (registered trademark) 202BC) was disposed on one surface of Prepreg a1 obtained above, Thermosetting Resin Film A was disposed on the other surface of Prepreg a1 such that the resin composition layer faced the prepreg, and the laminate was roll-laminated under conditions of a heating temperature of 100° C. and a pressure of 0.3 MPa/m by using a heat and pressure roll, thereby producing Prep reg a2 having a resin composition layer on one surface thereof.

Next, in the same order as described above, another Prepreg a2 having a resin composition layer on one surface thereof was produced.

The PET film derived from Thermosetting Resin Film A was peeled off from each of Prepreg a2 having the resin composition layer on one surface thereof and another Prepreg a2 having the resin composition layer on one surface thereof, so that the PET films were disposed such that the resin composition layers face each other, and roll-laminated under conditions of a heating temperature of 110° C. and a pressure of 0.2 MPa/m. Thereafter, the release aluminum foils attached to both surfaces were peeled off to produce Prepreg A having the configuration illustrated in FIG. 1.

(Production of Printed Circuit Board)

In order to produce a printed circuit board, first, a circular pattern having a diameter of 25.4 mm was disposed on an FR-4 grade double-sided copper clad laminate (manufactured by Hitachi Chemical Co., Ltd., trade name: MCL-E-679F, substrate thickness: 0.4 mm, copper foil thickness: 70 µm, and substrate size: 510 mm×510 mm) such that a residual copper rate (ratio of copper foil area after patterning to copper foil area before patterning) was 55%, thereby producing an inner layer substrate in which the copper foil on each of both surfaces was processed into the inner layer circuit.

Next, an inner layer adhesion treatment was performed on the surface of the inner layer circuit of the inner layer substrate obtained above by using an etching solution (manufactured by MEC Co., Ltd., trade name: CZ-8101, 1.5 µm treatment). Next, Prepreg A obtained above was disposed on each of both surfaces of the inner layer substrate, a copper foil (manufactured by Nippon Denkai, Ltd., trade name: YGP-35) was disposed on each of both sides of Prepreg A, and multilayering lamination was carried out under a vacuum atmosphere under conditions of a pressure of 2.5 MPa, a heating rate of 3° C./min, a maximum holding temperature of 185° C., and a holding time of 90 minutes, and a cooling time of 30 minutes using a vacuum pressure press, thereby producing a printed circuit board. A conceptual view illustrating the laminating order of each layer at the time of the multilayering lamination in Example 1 is illustrated in FIG. 3.

Example 2

Prepreg B having the configuration of the prepreg 200 illustrated in FIG. 4 was produced in the order shown below.
(Production of Prepreg B)

Thermosetting Resin Varnish A obtained in Example 1 was applied to glass cloth (manufactured by Nitto Boseki Co., Ltd., basis weight: 48 g/m$^2$, thickness: 55 µm, IPC style: 1080, and width: 530 mm) such that the content of the resin composition after drying was 68% by mass. Next, in order to remove the organic solvent and thermally cure the resin, heat curing was carried out by a hot air dryer at 150° C., and the curing degree was adjusted such that the gel time measured by a test method of No. 2. 3. 18 of IPC-TM-650 was 150±10 seconds, thereby obtaining Prepreg b1.

Next, Thermosetting Resin Varnish A obtained in Example 1 was applied onto a PET film (manufactured by Teijin DuPont Co., Ltd., trade name: G-2) having a width of 580 mm. The application amount was adjusted such that the application width was 525 mm and the thickness of the resin composition layer after drying was 15 µm. Next, in order to remove the organic solvent and thermally cure the resin, heat curing was carried out by a hot air dryer at 130° C., and the curing degree was adjusted such that the gel time measured by the same method as described above was 100±10 seconds, thereby producing Thermosetting Resin Film B.

In a state where Thermosetting Resin Film B was disposed on each of both surfaces of Prepreg b1 obtained above such that the resin composition layer faced Prepreg b1, Thermosetting Resin Film B was bonded to Prepreg b1 under lamination conditions of a heating temperature of 100° C., a vacuum state of 20 seconds, a pressing time of 30 seconds, and a pressure of 0.2 MPa by using a vacuum laminator (manufactured by Meiki Co., Ltd., trade name: MVLP-500), thereby producing Prepreg b2 having a resin composition layer on each of both surfaces thereof.

Next, another two Prepregs b1 were produced in the same order as described above.

The PET film derived from Thermosetting Resin Film B was peeled off from Prepreg b2 having the resin composition layer on each of both surfaces thereof, the another Prepreg b1 was disposed on each of both surfaces of the PET film, and the release aluminum foil was disposed on each of the surfaces of the another Prepreg b1 opposite to Prepreg b2, and the laminate was bonded under lamination conditions of a heating temperature of 100° C., a vacuum state of 20 seconds, a pressing time of 40 seconds, and a pressure of 0.2 MPa by using the vacuum laminator. Thereafter, the release aluminum foils attached to both surfaces were peeled off to produce Prepreg B having the configuration illustrated in FIG. 4.

(Production of Printed Circuit Board)

A printed circuit board was obtained in the same manner as in Example 1, except that Prepreg B was used as a prepreg. A conceptual view illustrating the laminating order of each layer at the time of the multilayering lamination in Example 2 is illustrated in FIG. 5.

Example 3

A prepreg C having the configuration of the prepreg 300 illustrated in FIG. 6 was produced in the order shown below.
(Production of Prepreg C)

Thermosetting Resin Film A produced in Example 1 was disposed on each of both surfaces of Prepreg b1 produced in Example 2 such that the resin composition layer faced Prepreg b1, and the laminate was bonded under conditions of a heating temperature of 100° C., a vacuum state of 20 seconds, a pressing time of 30 seconds, and a pressure of 0.2 MPa by using the vacuum laminator, thereby producing Prepreg c1 having the resin composition layer on each both surfaces thereof.

Next, another four Prepregs b1 were produced in the same order as described above.

Next, the PET film derived from Thermosetting Resin Film A was peeled off from Prepreg c1, two of the another Prepregs b1 were disposed on each of both surfaces of the PET film, and the release aluminum foil was disposed on each of the surfaces of the four other Prepregs b1 opposite to Prepregs c1, and the laminate was bonded under conditions of a heating temperature of 100° C., a vacuum state of 20 seconds, a pressing time of 40 seconds, and a crimping pressure of 0.2 MPa by using the vacuum laminator. Thereafter, the release aluminum foils attached to both surfaces were peeled off to produce Prepreg C having the configuration illustrated in FIG. 6.

(Production of Printed Circuit Board)

A printed circuit board was obtained in the same manner as in Example 1, except that Prepreg C was used as a prepreg and an FR-4 grade double-sided copper clad laminate (manufactured by Hitachi Chemical Co., Ltd., trade name: MCL-E-679F, substrate thickness: 0.4 mm, copper foil thickness: 210 μm, and substrate size: 510 mm×510 mm) was used as a copper clad laminate. A conceptual view illustrating the laminating order of each layer at the time of the multilayering lamination in Example 3 is illustrated in FIG. 7.

Comparative Example 1

Prepreg a1 was produced in the same manner as in Example 1. Two Prepregs a1 were disposed on each of both surfaces of the inner layer substrate produced by the same method as in Example 1, and multilayering lamination was carried out under the same conditions as in Example 1 to produce a printed circuit board. A conceptual view illustrating the laminating order of each layer at the time of the multilayering lamination in Comparative Example 1 is illustrated in FIG. 8.

Comparative Example 2

A printed circuit board was obtained in the same manner as in Comparative Example 1, except that in Comparative Example 1, three Prepregs a1 were disposed on each of both surfaces of the inner layer substrate. A conceptual view illustrating the laminating order of each layer at the time of the multilayering lamination in Comparative Example 2 is illustrated in FIG. 9.

Comparative Example 3

Prepreg b1 was produced in the same manner as in Example 2. Three Prepregs b1 were disposed on each of both surfaces of the inner layer substrate produced by the same method as in Example 1, and multilayering lamination was carried out under the same conditions as in Example 1 to produce a printed circuit board. A conceptual view illustrating the laminating order of each layer at the time of the multilayering lamination in Comparative Example 3 is illustrated in FIG. 10.

Comparative Example 4

A printed circuit board was obtained in the same manner as in Comparative Example 3, except that in Comparative Example 3, five Prepregs b1 were disposed on each of both surfaces of the inner layer substrate. A conceptual view illustrating the laminating order of each layer at the time of the multilayering lamination in Comparative Example 4 is illustrated in FIG. 11.

Comparative Example 5

Prepreg b1 was produced in the same manner as in Example 2. Five Prepregs b1 were disposed on each of both surfaces of the inner layer substrate produced by the same method as in Example 3, and multilayering lamination was carried out under the same conditions as in Example 1 to produce a printed circuit board. A conceptual view illustrating the laminating order of each layer at the time of the multilayering lamination in Comparative Example 5 is illustrated in FIG. 12.

Comparative Example 6

A printed circuit board was obtained in the same manner as in Comparative Example 5, except that in Comparative Example 5, seven Prepregs b1 were disposed on each of both surfaces of the inner layer substrate. A conceptual view illustrating the laminating order of each layer at the time of the multilayering lamination in Comparative Example 6 is illustrated in FIG. 13.

Comparative Example 7

Prepreg a2 having a resin composition layer on one surface thereof was produced in the same manner as in Example 1. Two Prepregs a2 were disposed on each of both surfaces of the inner layer substrate produced by the same method as in Example 1 such that the resin composition layer became an inner layer substrate side, and multilayering lamination was carried out under the same conditions as in Example 1 to produce a printed circuit board. A conceptual view illustrating the laminating order of each layer at the time of the multilayering lamination in Comparative Example 7 is illustrated in FIG. 14.

The prepregs and the printed circuit boards obtained above were evaluated by the following method.

(1) Moldability (Embeddability of Inner Layer Circuit)

The copper foil of the outermost layer of the printed circuit board obtained in each example was removed by etching, and the moldability (embeddability of the inner layer circuit) was confirmed by the unaided eye. Those in which defects such as voids were not confirmed was evaluated as good.

(2) Thickness of Printed Circuit Board

The thicknesses of the portions where the inner layer circuit of the printed circuit board obtained in each example was present were measured by using a micrometer (manufactured by Mitutoyo Corporation, trade name: high precision digimatic micrometer MDH-25M). In the measurement, the printed circuit board obtained in each example was divided into 5 vertical and horizontal divisions (a total of 25), the thicknesses of the portions where the inner layer circuit was present within each division was measured, and an average value (25 points) thereof was adopted as a thickness of the printed circuit board.

(3) Workability of prepreg (Powder Dropping Property)

The workability of the prepreg at the time of producing the printed circuit board was evaluated as the powder dropping property at the time of handling the prepreg. One piece of the prepreg produced in each example was placed on a clean sheet, and an operation of lifting up the prepreg and replacing the front and back thereof was repeated three times to weigh the weight of the resin that dropped off on the sheet.

TABLE 1

|  |  | Example | | | Comparative Example | | | | | | |
| --- | --- | --- | --- | --- | --- | --- | --- | --- | --- | --- | --- |
|  |  | 1 | 2 | 3 | 1 | 2 | 3 | 4 | 5 | 6 | 7 |
| Type of prepreg used for formation of fiber substrate layer | — | a1 | b1 | b1 | a1 | a1 | b1 | b1 | b1 | b1 | a1 |
| Number of fiber substrate layers laminated on one surface of printed circuit board | Sheet | 2 | 3 | 5 | 2 | 3 | 3 | 5 | 5 | 7 | 2* |
| Number of resin composition layers laminated on one surface of printed circuit board | Sheet | 1 | 2 | 2 | 0 | 0 | 0 | 0 | 0 | 0 | 2* |
| Thickness of conductor of inner layer circuit | μm | 70 | 70 | 210 | 70 | 70 | 70 | 70 | 210 | 210 | 70 |
| Thickness $T_A$ of resin composition layer | μm | 70 | 38 | 62 | — | — | — | — | — | — | 54 |
| Thickness $T_B$ of fiber substrate layer | μm | 96 | 55 | 55 | 96 | 96 | 55 | 55 | 55 | 55 | 96 |
| Ratio [$T_A/T_B$] of $T_A$ and $T_B$ | — | 0.73 | 0.69 | 1.12 | — | — | — | — | — | — | 0.56 |
| (1) Moldability (embeddability of circuit) | — | Good | Good | Good | Voids present | Good | Voids present | Good | Voids present | Good | Good |
| (2) Thickness of printed circuit board | mm | 1.21 | 1.14 | 1.64 | 1.04 | 1.35 | 1.09 | 1.25 | 1.51 | 1.91 | 1.20 |
| (3) Amount of powder dropping off | mg/sheet | 2.8 | 2.1 | 2.1 | 2.4 | 2.4 | 1.8 | 1.8 | 1.8 | 1.8 | 17.2 |

*In Example 7, two prepregs having a resin compoisition layer on only one surface thereof were used.

From Table 1, it can be seen that all of the prepregs of the present invention have good moldability, a small amount of powder dropping off, and excellent workability.

Meanwhile, in Comparative Examples 1 and 2 having the same fiber substrate layer as in Example 1, it can be seen that Comparative Example 1 in which the number of fiber substrate layers was the same as that in Example 1 was poor in moldability, and in order to obtain good moldability, the thickness of the printed circuit board needs to be increased by increasing the number of fiber substrate layers, as in Comparative Example 2. The same tendency can also be confirmed from the comparison between Example 2 and Comparative Examples 3 and 4, and between Example 3 and Comparative Examples 5 and 6.

Furthermore, from Comparative Example 7, it can be seen that the prepreg having the resin composition layer only on one surface thereof has a large amount of powder dropping off and thus is poor in workability.

REFERENCE SIGNS LIST

1: inner layer substrate (circuit board)
2: inner layer circuit (conductor)
11, 12, 21 to 23, and 31 to 35: fiber substrate layer
13, 24, 25, 36, and 37: resin composition layer
40: Fiber Substrate
50: Thermosetting Resin Composition
$T_A$: Thickness of Resin Composition Layer
$T_{B1}$, $T_{B2}$: Thickness of Fiber Substrate Layer
A: Direction
100: Prepreg A
200: Prepreg B
300: Prepreg C

The invention claimed is:

1. A printed circuit board, comprising
a cured product of a prepreg, the prepreg comprising two or more fiber substrate layers and one or more resin composition layers, wherein at least one of the one or more resin composition layers has a fiber substrate layer on each of both surfaces thereof, wherein when a thickness of the resin composition layer having a fiber substrate layer on each of both surfaces thereof is defined as $T_A$, and a thickness of a fiber substrate layer having a smaller thickness among the fiber substrate layers on both surfaces of the resin composition layer is defined as $T_B$,
a ratio [$T_A/T_B$] of $T_A$ and $T_B$ is from 0.25 to 5; and
a circuit board, wherein the circuit board has a conductor circuit layer having a thickness of 60 μm or more,
wherein the conductor circuit layer is in a state of being embedded by the cured product of the prepreg.

2. The printed circuit board according to claim 1, wherein the fiber substrate layers include glass cloth as a fiber substrate.

3. The printed circuit board according to claim 1, wherein the resin composition layer has a thickness of 10 to 200 μm.

4. A semiconductor package comprising the printed circuit board according to claim 1.

5. The printed circuit board according to claim 1, wherein the conductor circuit layer has a thickness of 100 μm or more.

6. The printed circuit board according to claim 1, wherein the conductor circuit layer has a thickness of 150 μm or more.

7. The printed circuit board according to claim 1, wherein the conductor circuit layer has a thickness of 180 μm or more.

8. The printed circuit board according to claim 1, wherein the conductor circuit layer has a thickness of 500 μm or less.

9. The printed circuit board according to claim 1, wherein the conductor circuit layer has a thickness of 400 μm or less.

10. The printed circuit board according to claim 1, wherein the circuit board comprises an inner layer substrate and the conductor circuit layer provided thereon.

11. A method for producing a printed circuit board, comprising:
laminate-molding a prepreg comprising two or more fiber substrate layers and one or more resin composition layers, wherein at least one of the one or more resin composition layers has a fiber substrate layer on each of both surfaces thereof, and a circuit board, which has a conductor circuit layer having a thickness of 60 μm or more, in a state where the prepreg and the conductor circuit layer face each other,
wherein when a thickness of the resin composition layer having a fiber substrate layer on each of both surfaces thereof is defined as $T_A$, and a thickness of a fiber substrate layer having a smaller thickness among the fiber substrate layers on both surfaces of the resin composition layer is defined as $T_B$,
a ratio $[T_A/T_B]$ of $T_A$ and $T_B$ is from 0.25 to 5.

* * * * *